Feb. 9, 1965 R. M. WHITEHORN 3,169,214

MOUNTING DEVICE FOR CIRCUIT BOARDS

Filed May 10, 1962

INVENTOR.
RICHARD M. WHITEHORN

BY Harry E. Aine

ATTORNEY

United States Patent Office 3,169,214
Patented Feb. 9, 1965

3,169,214
MOUNTING DEVICE FOR CIRCUIT BOARDS
Richard M. Whitehorn, Menlo Park, Calif., assignor to Varian Associates, Palo Alto, Calif., a corporation of California
Filed May 10, 1962, Ser. No. 193,710
6 Claims. (Cl. 317—99)

The present invention relates generally to electronic assembly mounting systems, and more specifically to a compact and inexpensive electronic assembly incorporating a plurality of stacked circuit boards carried by a mother board, useful, for example, in modular electronic assemblies for minimizing assembly time and component cost.

Heretofore, banks of printed circuit boards have been mounted on heavy, solid, parallel connecting side mounts, having slots or grooves machined therein for receiving the side edges of the printed circuit boards. Such side mounts are expensive to form and require brackets, gussets, and other types of mounting hardware to securely position the mounts on the mother board. Also, complex and often expensive locking devices were needed to securely hold the circuit boards in position, and yet make them readily accessible and removable in case a replacement module was needed.

In the present invention side mounts for the circuit boards are made from a thin, uniform stock, pressed into a side mount having a series of short, sharp turns or angles (zig-zag) and having grooves or guides provided in the vertex of each angle of the side mounting. The bottom of the side mounting is provided with tabs, which extend into aligned apertures in the mother board provided for receiving the side mounting. The tabs can be firmly secured to the mother board by soldering or by twisting them securely in position. Individual circuits boards are inserted into the mother board, guided by the grooves and are locked firmly into position by a retaining needle which is threaded through aligned apertures in the zig-zag side mounting and assembled circuit boards.

It is the object of the present invention to provide a compact and inexpensive printed circuit board assembly which provides for easy entry and replacement of the circuit boards and readily permits, if desired, locking of the circuit boards in position.

One feature of the present invention is provision of a side mount formed from a thin, uniform stock pressed into a zig-zag arrangement, in which individual circuit boards are supported and which provides for easy entry and removal of the circuit boards.

Another feature of the present invention is the provision of a retaining needle which threads through the side mount and captures the individual circuit boards to securely hold the circuit boards in position and readily permits locking of the circuit boards in position.

Figure 1:
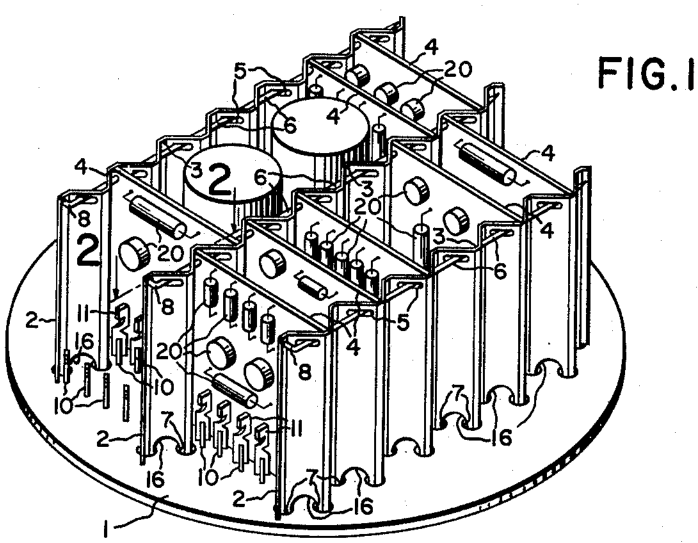
Figure 2:
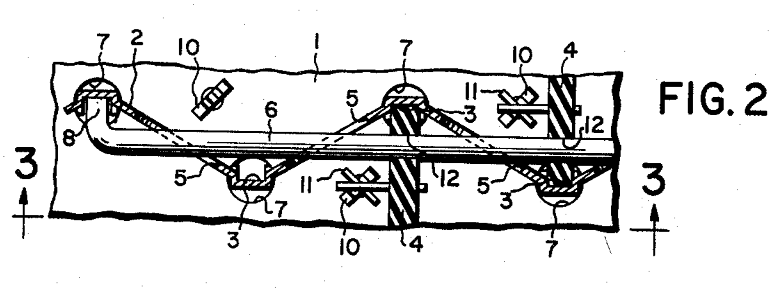
Figure 3:
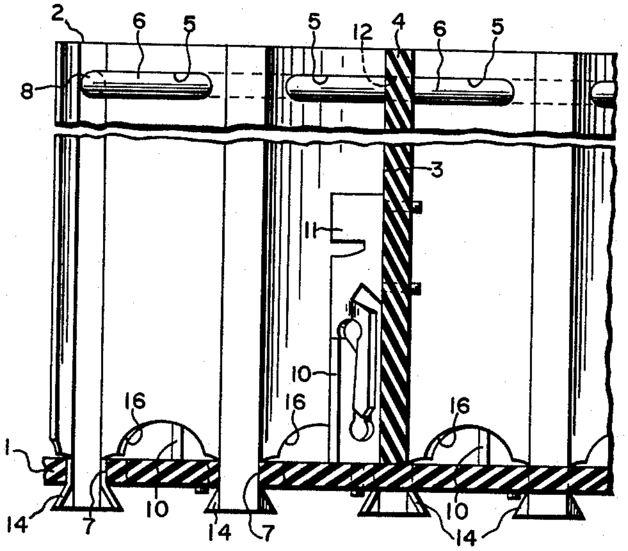

These and other features and advantages of the present invention will become more apparent upon a perusal of the following specification and drawings in which, FIG. 1 is perspective view of zig-zag side mountings mounted on a mother board for supporting an array of circuit boards, FIG. 2 is a fragmentary view taken along lines 2—2 in the direction of the arrows of FIG. 1, and FIG. 3 is a fragmentary view taken along lines 3—3 in the direction of the arrows of FIG. 2.

Referring now to the figures, there is shown a receptacle board or a so called mother board 1 as, for example, a large printed circuit card into which a plurality of interleaved circuit boards 4 are connected in one or more, if desired, separate columns. Circuit boards 4, as shown, are provided with printed circuit components 20 such as capacitors, transistors, etc., mounted thereon. The backside of mother board 1 contains printed wire leads for electrically interconnecting the circuits of boards 4 when they are positioned in their proper place. It is noted that any type of electrical connectors, wires for example, could be used to electrically connect the boards 4.

Mounted on mother board 1 are a plurality of (at least two) side mounts or guide fences 2 as of, for example, a thin metal stock which is easily pressed into a desired form. Side mounts 2 are formed, as by a metal press, into a zig-zag arrangement with each vertex in the zig-zag pattern having a narrow channel or guide slot 3 running laterally across the width of the side mount 2, and which protrude outwardly as tabs 14 (FIG. 3) to serve as supports for holding the side mounts 2 onto the mother board 1. One guide slot 3 supports a board 4 on one side of the side mount and two adjacent slots 3 support boards 4 on the other side of the side mount 2. Side mounts 2 are positioned in lateral registry on mother board 1 in such a manner that mutually opposed zig-zag guide fences 2 are symmetrical about the mid-plane between adjacent guide fences 2 to produce alternate wide and narrow spaces between adjacent side mounts. The circuit boards 4 are inserted into guide slots 3 at the wide portion of the zig-zag pattern in the side mounts 2 and are disposed substantially at right angles to the alignment of the guide fences 2. By this construction each side mount can support a series of interleaved circuit boards 4 on each of its sides.

The side mounts 2 are mounted on the mother board 1 in any suitable fashion, preferably by fitting support tabs 14 into registered holes or receptacles 7 provided in mother board 1. Support tabs 14 may then be twisted, bent or soldered to ensure a secure mounting on the mother board 1. The edge of the side mounts 2 have notches or semicircular portions 16 cut out between tabs 14 to avoid a long contact between guide-fence 2 and mother board 1 which could result in occasional loose tabs 14 or warped mother boards 1. Notches 16 also provide means of making lateral wire connections between laterally adjacent circuit boards on the guide-fence side of the mother board and can serve as air ducts for cooling purposes.

A plurality of oblong apertures 5 are cut near the top of the side mounts 2, in the spaces between adjacent guide slots 3, and are substantially perpendicular thereto to accommodate a retaining pin 6 slideable therethrough. The purpose of retaining pin 6 will be explained more fully below.

The zig-zag pattern gives lateral support to side mounts 2 so that no brackets, supports, etc. are required. The side mounts can be cantilevered without brackets, gussets, or other hardware from a single surface, in this instance a mother board 1. Also, since the side mounts have been formed from a thin, uniform sheet, only one inexpensive species need be stocked.

The upper corners of each circuit board 4 are apertured at 12, such that when they are inserted into guide slots 3 of the side mounts 2, retaining pin 6 may thread through the oblong apertures 5 in the mounts and apertures 12 in the circuit board 4 to hold the boards 4 in position.

Retaining pin 6 is provided with an L-shaped head 8 which may be twisted to fit in a free guide slot 3 of each side mount 2 to act as a lock to secure the retaining pins 6 into position.

The circuit boards 4 have a plurality of fork contacts 11 positioned on one side for mating with fork contacts 10 mounted on the mother board 1. The fork contacts 10 and 11 serve as intercircuit board connections for the entire circuit. In an alternative embodiment (not shown) these contacts are provided by means of pins which extend beyond the edge of the circuit board and fit into holes in the mother board.

With an interleaved column of circuit boards 4 positioned by laterally registering guide slots 3, and the retaining pins 6 in place, a very strong assembly for interconnection and support of circuit boards is realized. Further, the circuit boards are easily accessible for quick removal and replacement.

It is understood that as many side mounts 2 as desired may be positioned side by side to accommodate as many columns of circuit boards as desired. Also, a very effective cooling duct or wire-passage may be formed by placing a pair of guide-fences 2 in non-symmetric lateral registery and in relatively close proximity to each other having no circuit boards joining the fences 2.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. An electronic assembly mounting system comprising: a mother board; at least one integral side mount structure formed as a plurality of zig-zag guide fences continuously disposed upon said mother board to receive a plurality of circuit boards laterally extending between adjacent guide fences; a plurality of tabs extending outwardly from said guide-fences, said mother board having apertures for receiving and securing said tabs therein to ensure a firm mounting of said guide-fences upon said mother board.

2. The assembly according to claim 1 wherein said zig-zag guide-fences are provided with a plurality of aligned apertures therein to receive a locking pin therethrough for locking said circuit boards in position within said guide-fences.

3. The assembly according to claim 2 further including a retaining pin member threaded through said aligned aperture in said guide-fence to retain the circuit boards within said guide-fences.

4. The assembly according to claim 3 wherein said retaining pin includes a thin elongated member and having an eccentric portion, said eccentric portion serving as locking means for said pin when threaded through said guide.

5. The assembly according to claim 1 wherein said guide-fences are formed from a thin uniform sheet, pressed into a zig-zag pattern, said pattern including a guide slot being formed in each vertex of said fence.

6. The assembly according to claim 1 wherein a plurality of said guide-fences are mounted on said mother board substantially perpendicular thereto and such that alternate wide and narrow spaces are formed between adjacent guide-fences.

References Cited in the file of this patent

UNITED STATES PATENTS 2,832,013 Pedersen et al. ----------- Apr. 22, 1958

OTHER REFERENCES

Electrical Design News, page 25, March 1958.